United States Patent [19]

LeGresley

[11] 4,454,600
[45] Jun. 12, 1984

[54] PARALLEL CYCLIC REDUNDANCY CHECKING CIRCUIT

[75] Inventor: Barry P. LeGresley, Port Moody, Canada

[73] Assignee: AEL Microtel Limited, Burnaby, Canada

[21] Appl. No.: 411,203

[22] Filed: Aug. 25, 1982

[51] Int. Cl.³ ............................................. G06F 11/10
[52] U.S. Cl. ........................................ 371/25; 371/37
[58] Field of Search ................. 371/25, 37; 324/73 R, 324/73 AT

[56] References Cited

U.S. PATENT DOCUMENTS 3,452,328  6/1969  Hsiao et al. ........................... 371/37
3,703,705  11/1972  Patel ...................................... 371/37
3,859,630  1/1975  Bennett ................................. 371/37

OTHER PUBLICATIONS

Konemann et al., Built-In Test for Complex Digital Integrated Circuits, IEEE Journal of Solid-State Circuits, vol. SC-15, No. 3, Jun. 1980, pp. 315-319.

Primary Examiner—Charles E. Atkinson
Attorney, Agent, or Firm—Gregory G. Hendricks; Robert J. Black

[57] ABSTRACT

A parallel cyclic redundancy checking circuit which determines the validity of digital, binary, cyclical data. The parallel structure of this circuit enables it to check high frequency data. Shift registers store sequentially occurring parallel groups of data and a feedback network comprising exclusive-or gates provides a coding arrangement which produces a resultant data pattern to indicate the validity of the cyclical parallel input data. Resultant data patterns are periodically stored in a random-access-memory which initializes the shift registers to provide a time sharing operation. A comparator detects invalid data by comparing the resultant patterns with expected values.

12 Claims, 2 Drawing Figures

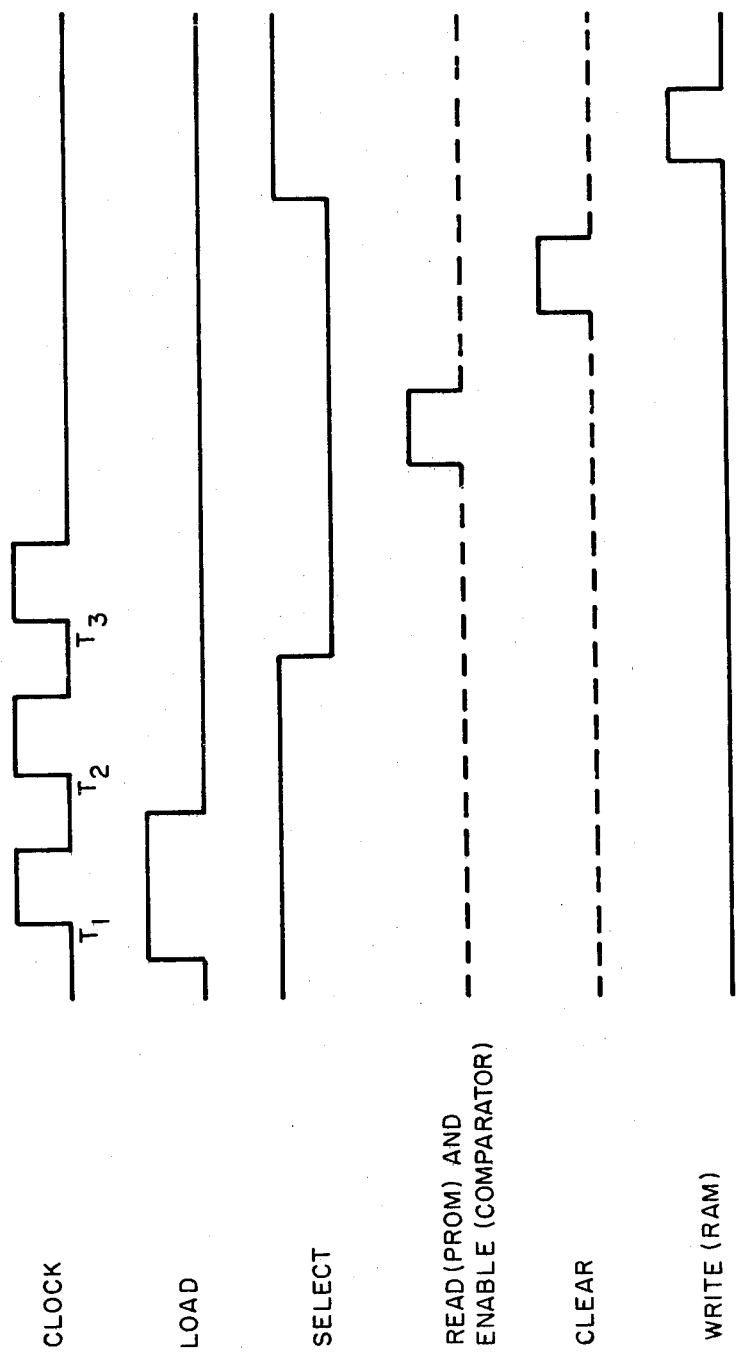

PARALLEL CYCLIC REDUNDANCY CHECKING CIRCUIT

FIELD OF THE INVENTION

The present invention relates to data verification circuits and more particularly to a timeshared parallel cyclic redundancy checking circuit.

BACKGROUND OF THE INVENTION

Cyclical redundancy checking circuits are well known. However they typically use a serial logic configuration comprising a 16-bit shift register with four outputs fed back to exclusive-or logic at the input. An example of such a circuit is the Hewlett Packard Signature Analysis System.

This serial configuration of the prior art requires that each data bit be clocked serially into the cyclical redundancy checking circuit. The time required to perform this operation is therefore equivalent to the number of bits per sample multiplied by the period of the CLOCK signal. For many applications such an arrangement requires more time than is allowed between successive input data groups.

Accordingly the present invention provides a high speed cyclic redundancy checking circuit capable of determining the validity of multiple, high frequency, cyclical parallel groups of data on a time-sharing basis.

SUMMARY OF THE INVENTION

The parallel cyclic redundancy checking circuit of the present invention determines the validity of cyclical data. Eight data bits, e.g. a pulse code modulation (PCM) sample data group, are periodically applied to the input of this circuit. Therefore each data pattern is repeated after a predetermined time. An example of a typical source of such cyclical data is a digital tone generator which produces multiple tones, e.g. 126, each consisting of cyclical 8-bit data groups.

Each 8-bit data group is divided into four groups of two bits each. A first SELECT pulse enables the first bit of each of the four groups, e.g. odd numbered bits, to pass through a data selection circuit, and a second select pulse enables the second bit, of each group e.g. even numbered bits, to pass through the data selection circuit. Therefore, all eight bits are transferred into the checking circuit during the same time that only two bits could be transferred in the conventional circuit.

The data selection circuit has four output signals, one for each group of two bits. Each output signal is applied to a shift register via an exclusive-or gate. The output signal from each shift register is applied to another exclusive-or gate, and the output signal from this gate is then combined with an associated output signal from the data selection circuit. These signals are then fed back into the shift register via the first exclusive-or circuit.

At the end of each tone cycle, an ENABLE (COMPARATOR) signal is generated, the shift registers are cleared and written into memory to ensure that each new cycle begins with new data. At the beginning of each new cycle, a LOAD signal is generated to retrieve data from memory and load it into the shift registers. These shift registers are then clocked by a CLOCK signal which occurs in synchronism with each 4-bit data group. Therefore each group of four data bits are clocked through the data selection circuit and applied to the inputs of the shift register via an exclusive-or circuit whose output is dependent on both the incoming data bits and contents of the shift register. This exclusive-or circuit is connected to selected parallel outputs of each shift register to provide a data coding arrangement which has a high probability of detecting an invalid data pattern.

After each pair of data groups (eight bits) are logically combined by the exclusive-or circuit and stored in the shift registers, a WRITE signal is generated to cause the shift register contents to be stored in memory. Thus each 8-bit group of data is processed, stored in memory, and retrieved for processing with subsequent 8-bit groups. After a complete cycle of such data groups the ENABLE (COMPARATOR) signal is generated to determine if there has been a data failure by comparing the resultant shift register data to expected resultant data stored in a read-only-memory. At this time the shift registers are again cleared in preparation for the next cycle of 8-bit data groups.

By processing each 8-bit data group in parallel and storing its result in memory sufficient speed of operation is realized to allow processing of other data groups in the interim between subsequent data groups of each individual tone. For example, each data group of a 126 tone generator can be processed before the subsequent data group of the first tone is generated. Such time-sharing operation is made possible by the parallel structure of this circuit.

DESCRIPTION OF THE DRAWING

FIG. 2 is a timing diagram showing the relative timing of CLOCK, LOAD, SELECT, CLEAR and WRITE signals.

DESCRIPTION OF THE PREFERRED EMBODIMENT

Figure 1:
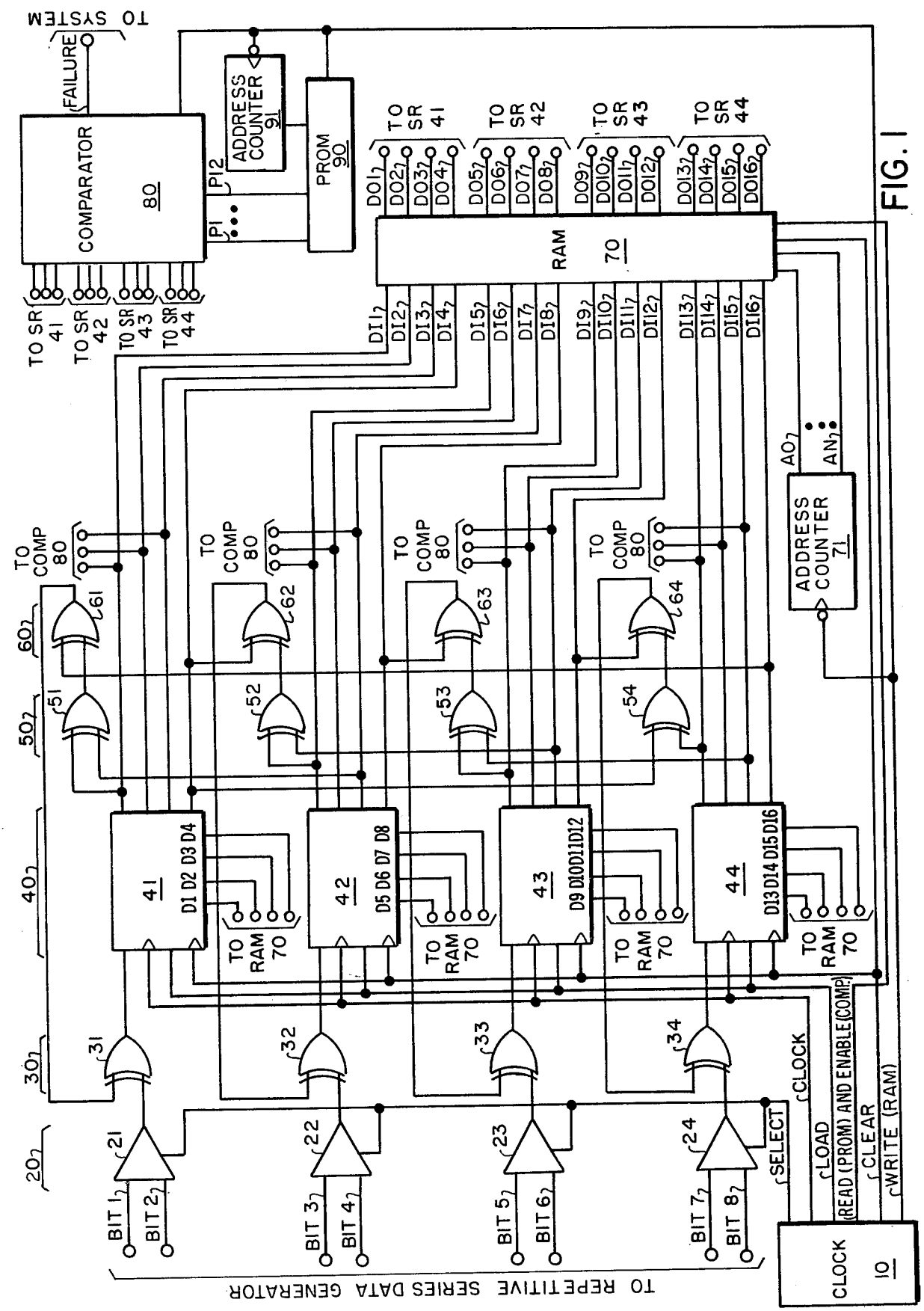
FIG. 1 is a schematic diagram of the cyclic redundancy checking circuit of the present invention.

Referring now to FIG. 1, the cyclic redundancy checking circuit of the present invention is shown connected to a repetitive series data generator. Data selection circuit 20 includes a plurality of 2:1 selectors, each of which is connected between the repetitive series data generator and an associated exclusive-or gate in exclusive-or circuit 30.

The output of these exclusive-or gates is connected to an associated shift register in shift register circuit 40. Exclusive-or circuit 50 includes a plurality of exclusive-or gates, each connected to two shift registers. Exclusive-or circuit 60 is connected to a third shift register and the output of an associated exclusive-or gate in exclusive-or circuit 50. The output of each exclusive-or gate in exclusive-or circuit 60 is then connected to an input of an associated exclusive-or gate in exclusive-or circuit 30.

Clock circuit 10 is connected to data selection circuit 20 via a SELECT lead, and it is connected to shift register circuit 40 via CLOCK, LOAD and ENABLE (COMPARATOR) leads. Clock circuit 10 is also connected to (PROM) 90, address counter 91, and comparator 80 via the ENABLE (COMPARATOR) lead. Clock circuit 10 is further connected to address counter 71 via the LOAD lead and (RAM) 70 via a WRITE lead. Address counter 71 is also connected to RAM 70 via address leads A0 to AN. Shift register circuit 40 is also connected to RAM 70 via leads DI-1 to DI-16 and to comparator 80 via leads DI-1-103, 5 to 7, 9 to 11 and 13 to 15. RAM 70 is further connected to shift register circuit 40 via leads DO1 to DO16.

Parallel 8-bit data samples are periodically applied to the inputs of data selection circuit 20 with two bits being applied to each of the four 2:1 selectors, 21-24.

The SELECT signal from clock circuit 10 alternately enables the odd and even bits through data selection circuit 20. Thus bits 1, 3, 5 and 7 are applied to the second input of exclusive-or gates 31, 32, 33 and 34, respectively, while the SELECT signal is at a logic level 1. Similarly bits 2, 4, 6 and 8 are applied random access to the second input of exclusive-or gates 31, 32, 33 and 34, respectively, while the SELECT signal is at logic level 0. Depending on whether a logic level 0 or logic level 1 signal is applied by exclusive-or circuits 50 and 60 to the first input of exclusive-or gates 31, 32, 33 and 34, the bit patterns applied to the second input of each of these gates is either gated to the associated shift register unchanged or inverted and then gated to the associated shift register.

Clock circuit 10 generates an ENABLE (COMPARATOR) signal at the end of each series of parallel data groups, to enable comparator 80 which then compares the resultant signals from shift register circuit 40 to the expected signals displayed by PROM 90 in response to a READ (PROM) signal also generated by clock circuit 10. Subsequently, clock circuit 10 generates a CLEAR signal which clears shift register circuit 40. Clock circuit 10 then generates a WRITE signal to clear the RAM locations which store the resultant shift register signals associated with each series of parallel data groups. These READ and ENABLE, and CLEAR signals are only generated in association with the last data group of each tone. PROM address counter 91 and RAM address counter 71 are each incremented on the trailing edge of the READ and WRITE signals, respectively, in order that the proper word of memory will be available for the next READ or WRITE signal. An example of a typical repetitive series data generator is a tone generator capable of producing repetitive series of 8-bit parallel data groups for 126 different tones. For such a tone generator, a 126 word RAM and a 126 word PROM would be required to store expected and resultant data patterns for each tone.

Therefore, after an ENABLE (COMPARATOR) signal shift registers 41-44 all have logic level 0 signals on their outputs. Each exclusive-or gate in exclusive-or circuit 50 then provides a logic level 0 at its output since logic level 0 signals appear at both inputs. Similarly logic level 0 signals from an associated shift register and the associated exclusive-or gate in exclusive-or circuit 50 appear at both inputs of each exclusive-or gate in exclusive-or circuit 60. Therefore the outputs of these gates provide a logic level 0 signal to the input of the associated exclusive-or gate in exclusive-or circuit 30.

Since one input of each of these gates has a logic level 0 signal applied to it, the signal at the other input, from the associated data selector circuit, will be gated through the exclusive-or gate and applied to the input of corresponding shift register in shift register circuit 40. The data applied to the inputs of the shift registers is then clocked into each shift register on the next CLOCK pulses from clock circuit 10.

Each pair of exclusive-or gates in exclusive-or circuits 50 and 60 is connected to outputs from shift registers in shift register circuit 40 according to a predetermined pattern. This pattern is arranged such that each exclusive-or gate pair is connected to the first, third and fourth outputs of three different shift registers. For example, exclusive-or gate pair, 51 and 61, is connected to the first output of shift register 41, the third output of shift register 42 and the fourth output of shift register 44.

Exclusive-or circuits 50 and 60 thus produce a coded signal based on the data stored in shift register circuit 40. These coded signals are fed back to the first input of exclusive-or circuit 30. If a logic level 1 signal appears at the first input of an exclusive-or gate in exclusive-or circuit 30, then the signal at the other input, from the associated data selector circuit, will be inverted and then clocked into the associated shift register.

Through use of this arrangement of exclusive-or circuits, incoming data bits are logically gated, or inverted, and stored in RAM 70. When the next data group for a particular tone is generated, the stored pattern is transferred from RAM 70 to shift register circuit 40, in response to a LOAD signal generated by clock circuit 10. This stored pattern is then coded by exclusive-or circuits 50 and 60, and fed back to exclusive-or circuit 30 where it is combined with that next data pattern, clocked into shift register circuit 40 and then stored in RAM 70. Thus incoming data bits are coded in such a manner that the pattern stored in RAM 70 at the end of each series of incoming data groups, has a high probability of indicating the validity of such entire series of data. Since the input data is provided by a repetitive series data generator, valid input data is known and consequently the resultant pattern of such a series of valid data can be computed. This resultant data pattern is stored in PROM 90. Comparator 80 then compares the data in PROM 90 to the resultant data stored in shift register circuit 40 at the end of each series of input data to determine whether any input data bit is incorrect.

The present invention thus provides a cyclic redundancy check on parallel input data through use of a shift register circuit, an exclusive-or circuit which is fed back to the input of the shift register circuit, a RAM, a PROM and a comparator. The exclusive-or circuit generates a resultant pattern representing a complete cycle of input data which is compared to an expected data pattern to determine if there has been a failure in the input data.

It will be obvious to those skilled in the art that numerous modifications of the present invention can be made without departing from the spirit of the invention which shall be limited only by the scope of the claims appended hereto.

What is claimed is:

1. A cyclic redundancy checking circuit for use in a data verification system including a data generator operated to provide a plurality of repetitive series of groups of parallel data bits, normally having predetermined values, and a signal generator operated to periodically provide load and write signals both associated with each group of parallel data bits and further operates to periodically provide comparator enable and read signals, both associated with each series of groups of parallel data bits, said cyclic redundancy checking circuit comprising:
   first coding means connected to said data generator, operable to provide a first coded signal associated with each group of parallel data bits;
   first-in-first-out storage means of predetermined capacity connected to said signal generator and said first coding means, said storage means capable of being initialized in response to said load signal, and operative to store a predetermined number of said first coded signals and further operative to provide a storage signal associated with each stored first coded signal;

second coding means connected to said storage means, operative in response to said storage signal to provide a second coded signal;

said first coding means further connected to said second coding means, operative in response to each group of parallel data bits and said second coded signal to provide said first coded signal;

first memory means, connected to said storage means and said signal generator, operative in response to said write signal to store said storage signal, further operative in response to said load signal to read out said storage signal;

said storage means operative in response to said load signal to store said displayed storage signal, whereby said storage means is initialized;

second memory means connected to said signal generator, storing a plurality of predetermined memory signals, operative in response to each read signal to readout a predetermined memory signal; and comparison means connected to said storage means, said signal generator and said second memory means, operative in response to said comparator enable signal to compare said memory signal to said storage signal, whereby a failure in said repetitive series of groups of parallel data bits is detected.

2. A cyclic redundancy checking circuit as claimed in claim 1, wherein said signal generator periodically operates to provide a select signal associated with each group of parallel data bits, said cyclic redundancy checking circuit further comprising: a plurality of data selectors each connected to said signal generator and further connected between said data generator and said first coding means, each operative in response to said select signal to gate a first selected data bit of each group of parallel data bits to said first coding means, and further operative in response to an absence of said select signal to gate a second selected data bit of each group of parallel data bits to said first coding means.

3. A cyclic redundancy checking circuit as claimed in claim 2, wherein said first coding means comprises: a first plurality of exclusive-or gates, each connected to an associated one of said data selectors, each operative to provide first or second coded data bits associated with said first or second selected data bits, respectively.

4. A cyclic redundancy checking circuit as claimed in claim 3, wherein said signal generator further operates to provide a clock signal associated with each group of parallel data bits, said storage means comprising:

a plurality of shift registers each having a clock input, and a clear input, both connected to said signal generator, each shift register further having a serial input connected to an associated one of said plurality of exclusive-or gates, and each shift register further having a plurality of parallel inputs connected to said first memory means and a plurality of associated bit positions and outputs; each shift register operative in response to said comparator enable signal to provide a logic level 0 signal on each output; each shift register further operative to sequentially store each first and second coded data bit, on an alternating basis, in response to each alternate clock pulse; each shift register further operative to shift all stored data bits by one bit position, in response to each clock pulse; each shift register further operative in response to said load signal to store said displayed storage signal, whereby said storage means is initialized via said parallel inputs; and each shift register further operative to provide a plurality of stored data bit signals on said plurality of outputs.

5. A cyclic redundancy checking circuit as claimed in claim 4, wherein each shift register has at least three outputs, said second coding means comprising:

a second plurality of exclusive-or gates each having first and second inputs, each of said second plurality having its first input connected to a first output of a first associated shift register, each of said second plurality having its second input connected to a second output of a second associated shift register; and a third plurality of exclusive-or gates, each having first and second inputs, each of said third plurality having its first input connected to an associated one of said second plurality of exclusive-or gates, and each of said third plurality having its second input connected to a third output of a third associated shift register, each of said second and third pluralities of said exclusive-or gates operative in combination, in response to said stored data bit signals appearing at said first, second and third outputs to provide a third coded data bit.

6. A cyclic redundancy checking circuit as claimed in claim 5, wherein: said first plurality of exclusive-or gates is further connected to an associated one of said third plurality of exclusive-or gates, each of said first plurality of exclusive-or gates operated in response to said third coded data bit and said first or second selected data bits, to provide said first or second coded data bit, respectively.

7. A cyclic redundancy checking circuit as claimed in claim 2, wherein each group of parallel data bits includes eight bits, said plurality of data selectors includes four data selectors each associated with two of said parallel data bits.

8. A cyclic redundancy checking circuit as claimed in claim 3, wherein said first plurality of exclusive-or gates includes four such gates.

9. A cyclic redundancy checking circuit as claimed in claim 4, wherein said storage means comprises:
four 4-bit shift registers each having four outputs.

10. A cyclic redundancy checking circuit, as claimed in claim 1, wherein said first memory means comprises:
a random-access memory connected to an address counter.

11. A cyclic redundancy checking circuit as claimed in claim 1, wherein said second memory means comprises:
a read-only memory connected to an address counter.

12. A cyclic redundancy checking circuit as claimed in claim 1, wherein said comparison means comprises a digital comparator.

* * * * *